United States Patent [19]
Hotta

[11] Patent Number: 6,081,476
[45] Date of Patent: Jun. 27, 2000

[54] CLOCK-SYNCHRONIZED READ-ONLY MEMORY

[75] Inventor: Yasuhiro Hotta, Nara, Japan

[73] Assignee: Sharp Kabushiki Kaisha, Japan

[21] Appl. No.: 09/119,955

[22] Filed: Jul. 21, 1998

[30] Foreign Application Priority Data

Jul. 23, 1997 [JP] Japan ................................. 9-196794

[51] Int. Cl.⁷ .................................................. G11C 8/00
[52] U.S. Cl. .............................................................. 365/233
[58] Field of Search ............................. 365/233, 230.06, 365/230.08, 189.05, 94, 103, 104, 185.11

[56] References Cited

U.S. PATENT DOCUMENTS

| | | | |
|---|---|---|---|
| 5,278,786 | 1/1994 | Kawauchi et al. | 365/185.11 |
| 5,381,366 | 1/1995 | Kawauchi et al. | 365/233 |
| 5,386,385 | 1/1995 | Stephens, Jr. | 365/189.05 |
| 5,448,528 | 9/1995 | Nagai | 365/233 |
| 5,539,696 | 7/1996 | Patel | 365/233 |
| 5,568,427 | 10/1996 | Takemae | 365/233 |
| 5,751,656 | 5/1998 | Schaefer | 365/233 |
| 5,781,468 | 7/1998 | Matsuo et al. | 365/189.05 |
| 5,793,665 | 8/1998 | Kim et al. | 365/233 |
| 5,812,491 | 9/1998 | Shinozaki et al. | 365/233 |
| 5,831,932 | 11/1998 | Merrit et al. | 365/233 |
| 5,835,445 | 11/1998 | Nakamura | 365/233 |
| 5,841,731 | 11/1998 | Shinozaki | 365/233 |

FOREIGN PATENT DOCUMENTS 07093970  4/1995  Japan .

*Primary Examiner*—Trong Phan
*Attorney, Agent, or Firm*—Morrison & Foerster LLP

[57] ABSTRACT

A clock-synchronized read only memory includes: a memory cell and a mode register for setting an operation mode, the clock-synchronized read only memory outputting data stored in the memory cell in the operation mode set in the mode register and in synchronization with a clock signal. The contents of the mode register are set when the data is written to the memory cell, the contents defining the operation mode.

4 Claims, 7 Drawing Sheets

CLOCK-SYNCHRONIZED READ-ONLY MEMORY

BACKGROUND OF THE INVENTION

1. Field of the Invention

The present invention relates to a mask ROM of a clock-synchronized type (hereinafter referred to as "synchronous mask ROM") for inputting and outputting data. In particular, the present invention relates to a synchronous mask ROM which includes a register for setting an operation mode and operates in an operation mode (defined by burst length, wrap type, and CAS latency) which is determined in accordance with the contents set in the mode register.

2. Description of the Related Art

In recent years, memories which permit faster access have been in demand due to improvements in the operation frequencies of microprocessors. Answers to such demands include clock-synchronized type memories, e.g., synchronous DRAMs.

A synchronous DRAM includes a mode register for setting an operation mode. By setting an operation mode (defined by burst length, wrap type, and CAS latency) in the mode register, the synchronous DRAM can perform an operation which is optimally selected for any given system incorporating the synchronous DRAM.

Herein, the "burst length" refers to the number of data units which can be consecutively input or output. For example, either 1, 2, 4, 8 or a full-page can be selected as the burst length. The "wrap type" refers to the manner in which column addresses, which are internally generated during a burst access, are varied. For example, either a sequential method (under which the column addresses are sequentially changed within the same bank) or an interleave method (under which the column addresses are scrambled) can be selected as the wrap type. The "CAS latency" refers to the number of clock pulses that elapse before the first data is read after inputting a read command. For example, either 1, 2, or 3 can be selected as the CAS latency.

FIG. 8 is a block diagram schematically illustrating the structure of a synchronous DRAM.

The synchronous DRAM shown in FIG. 8 includes a memory cell array 21, a row decoder 22, a column decoder 23, a row address buffer 24, a column address buffer 25, a data control circuit 26, a data input/output buffer 27, a control logic 28, and a mode register setting circuit 29. The mode register setting circuit 29 includes a mode register 31 as shown in FIG. 9.

In FIG. 8, SS denotes an output signal from the mode register within the mode register setting circuit 29, which is input to the control logic 28.

As can be seen in FIG. 9, the mode setting function of the synchronous DRAM is accomplished by inputting to the input-only pins various codes (commands) which represent operations. Usually, a chip select signal CS/, a row address strobe signal RAS/, a column address strobe signal CAS/, and a write enable signal WE/ are set to the "Low" level, and address terminals A0 to A6 are utilized as terminals for inputting data.

FIG. 9 is a simplified diagram showing the structure of the mode register setting circuit 29. The mode register setting circuit 29 includes AND gates 35, 36, and 37 as well as the mode register 31. The mode register 31 includes 3-bit D flip-flops 32, 33, and 34. The outputs of the D flip-flops 32, 33, and 34 represent the burst length, wrap type, and CAS latency, respectively. In practice, however, one flip-flop may be dedicated for each of 1, 2, 4, 8, and a full-length that defines the burst length; one flip-flop is similarly dedicated to each value of any other parameter, although not shown in FIG. 9.

Each of the AND gates 35, 36, and 37 is opened responsive to a mode register set signal MRS. The output of each of the AND gates 35, 36, and 37 is determined in accordance with the value of a 7 bit address A0 to A6 and the mode register set signal MRS. The mode register set signal MRS is the output of the AND gate 38. It is possible to set a given operation mode in the mode register 31 by setting the chip select signal CS/, the row address strobe signal RAS/, the column address strobe signal CAS/, and the write enable signal WE/ to the "Low" level and concurrently supplying a predetermined address value A0 to A6.

A mode setting in the mode register is performed in an initialization routine before memory access. Before access to a memory occurs, the user sets the content of the mode register in accordance with the memory accessing specification and intended mode of use of the memory. Among the parameters of the operation mode which is set in the mode register, the "CAS latency" refers to the number of clock pulses that elapse before the first data is read or written after latching a CAS address (column address) during a memory access. Therefore, if the CAS latency is set to "2", the first data will be read or stored 2 clock pulses after latching a CAS address.

In general, a semiconductor memory such as a DRAM requires some time after power is supplied to the memory until the power voltage Vcc becomes stabilized to a predetermined potential so as to stabilize the internal circuitry. A given operation mode may be set in the mode register in the above-described sequence. This prolongs the time which elapses before the memory becomes accessible after power is supplied. Furthermore, it is necessary to set a mode via an initialization routine or the like, which needs to be run before a memory access occurs after supplying power.

As a solution to the above problem, it has been proposed in the field of synchronous DRAMs to set initial values for the mode register by means of non-volatile switching elements (e.g., laser fuses or electric fuses) and automatically set the initial values in the mode register upon detecting the rise of the power voltage after power is supplied, thereby reducing the complexity associated with mode setting via an initialization routine or the like (Japanese Laid-Open Publication No. 7-93970).

In recent years, not only synchronous DRAMs but also mask ROMs have been required to operate faster by utilizing clock synchronization. However, using laser fuses or the like for setting initial values, e.g., CAS latency, would result in a larger number of manufacturing steps of the device and hence increased manufacturing cost of mask ROMS. Similarly, it would be inefficient to manufacture devices with different settings (with respect to e.g., CAS latency) in accordance with respectively different device specifications. Furthermore, it would complicate the mask ROM structure if writing to a mode register of a mask ROM was enabled because a mask ROM is by nature a read only memory.

SUMMARY OF THE INVENTION

A clock-synchronized read only memory including a memory cell and a mode register for setting an operation mode, the clock-synchronized read only memory outputting data stored in the memory cell in the operation mode set in the mode register and in synchronization with a clock signal, wherein contents of the mode register are set when the data is written to the memory cell, the contents defining the operation mode.

In one embodiment of the invention, the mode register includes a MOS transistor having a channel region, and the contents which are set in the mode register are written by selectively implanting ions of an impurity into the channel region of the MOS transistor, the impurity having a different conductivity type from a conductivity type of the channel region of the MOS transistor.

In another embodiment of the invention, the implantation of the ions of the impurity is performed by using a mask which is used when writing the data to the memory cell.

In the manufacturing process of a mask ROM in general, data must be written to the memory cells. In accordance with a synchronous mask ROM of the present invention, initial values for a mode register are also set during this step of writing data to the memory cells. Since the data writing in a mask ROM is generally made in accordance with the demands of a user, the present invention makes it possible to set an operation mode which is in accordance with each specification desired by each user. Thus, initial values can be set in the mode register without employing any additional steps during manufacture, thereby preventing a substantial increase in chip cost.

Thus, the invention described herein makes possible the advantage of providing a mask ROM which allows a mode register setting without the need to employ an additional manufacturing step, thereby preventing an increase in chip cost.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples, with reference to the accompanying Figures.

Figure 1:
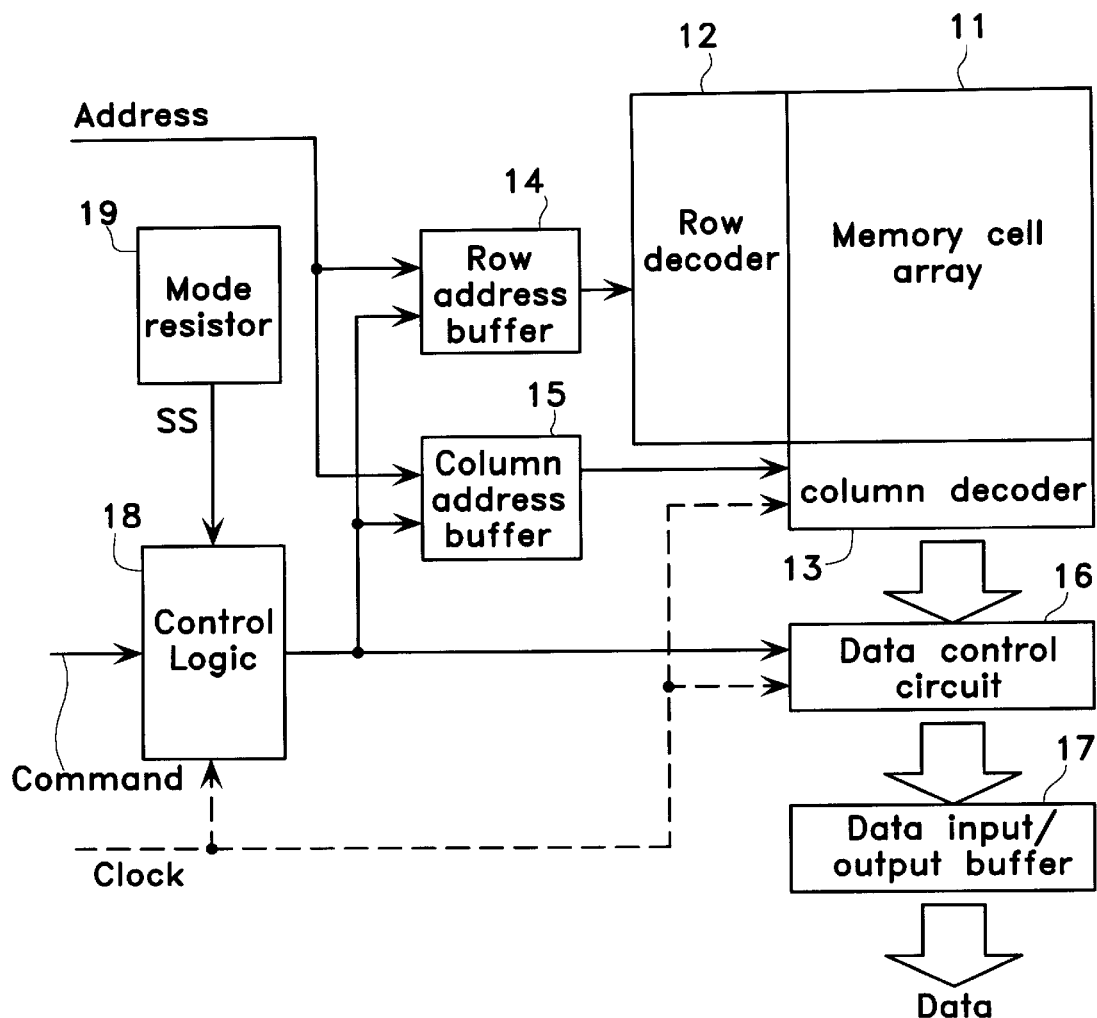
FIG. 1 is lock diagram schematically illustrating the structure of a synchronous mask ROM according to the present invention.

FIG. 1 is a block diagram schematically illustrating the structure of a synchronous mask ROM according to the present invention.

The synchronous mask ROM shown in FIG. 1 includes a memory cell array 11, a row decoder 12, a column decoder 13, a row address buffer 14, a column address buffer 15, a data control circuit 16, a data output buffer 17, a control logic 18, and a mode register 19. In FIG. 1, SS denotes a signal (operation mode signal) which is output from the mode register 19 and input to the control logic 18. As a result, the synchronous mask ROM operates in a mode which is set in the mode register. While the present invention relates to a novel synchronous mask ROM, it will be appreciated that the operation mode signal and the modes which can be set therein may be the same signal and modes as those employed in a standard synchronous DRAM.

Hereinafter, a method for setting initial values in the mode register 19 will be described with reference to FIGS. 2A and 2B.

Figure 2A:
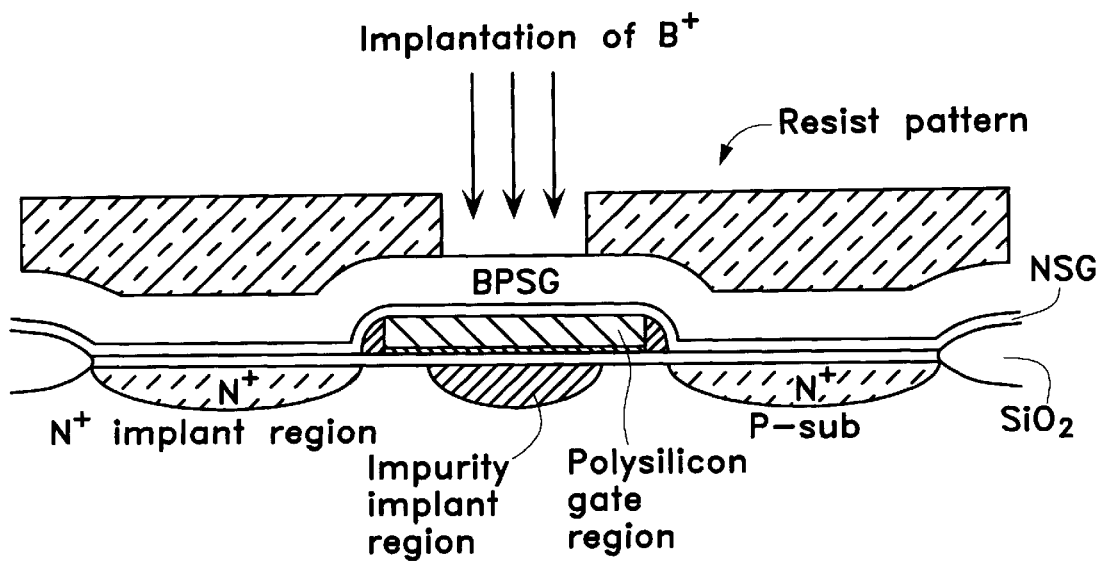
FIG. 2A is a cross-sectional view showing a mode register 19 in relevant part.
Figure 2B:
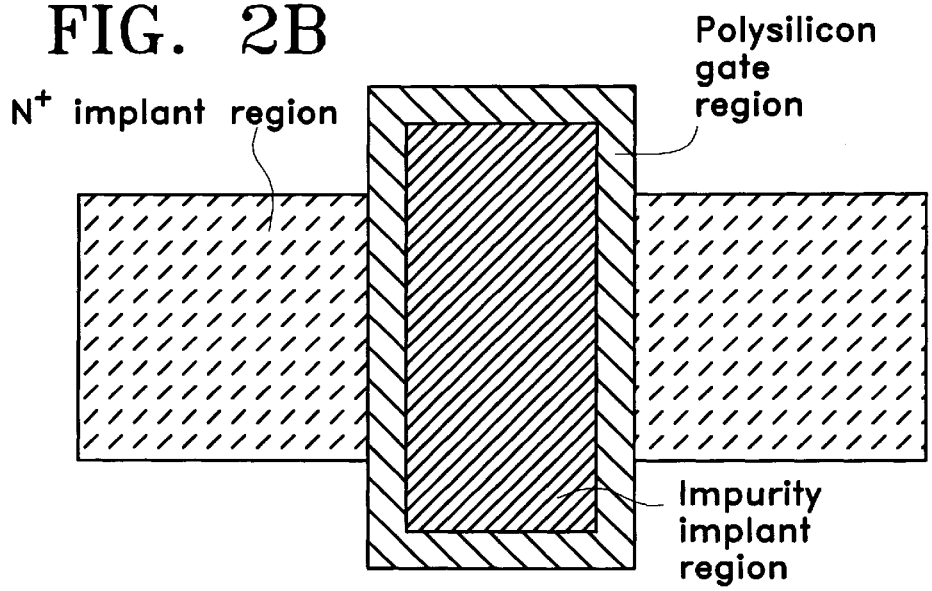
FIG. 2B is a plan view of the mode register 19 in relevant part.

FIG. 2A is a cross-sectional view showing the mode register 19 in relevant part. FIG. 2B is a plan view of the mode register 19 in relevant part.

Figure 2C:
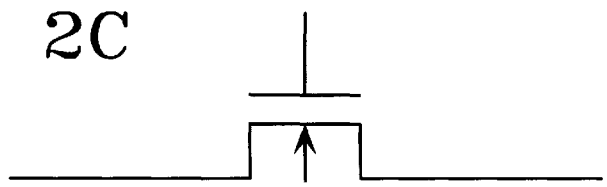
FIG. 2C shows an equivalent circuit diagram of the portion of the mode register 19 shown in FIG. 2A.

The portion of the mode register 19 depicted in FIG. 2A includes a P substrate, an N+ implant region, a polysilicon gate region, an SiO$_2$ region, an non-doped silicate glass (NSG) region, and a boron phosphorous silicate glass (BPSG) region. A resist patten is formed on the boron phosphorous silicate glass (BPSG) except above the region into which an impurity is implanted. FIG. 2C shows an equivalent circuit diagram of a portion of the mode register 19 of FIG. 2A (FIG. 2C illustrates the portion of the mode register 19 as being conductive). In the illustrated example, the source-drain path will conduct without impurity ions being implanted. When impurity ions are implanted, the source-drain path will not conduct.

In the synchronous mask ROM according to the present invention, setting of initial values in the mode register 19 is performed concurrently with the writing of data to the memory cells.

In general, the writing of data to a mask ROM is accomplished by implanting, into a channel region of each memory cell transistor, ions of an impurity having the same conductivity type as that of the substrate (or well), i.e., an impurity having a different conductivity type from that of the conductivity type of the channel region of the memory cell. For example, in the case of cells composed essentially of NOR-type N channel MOSFETS, the memory cells are turned ON or OFF depending on the presence or absence of implantation of ions of boron (B), which is a P-type impurity.

Figure 3:
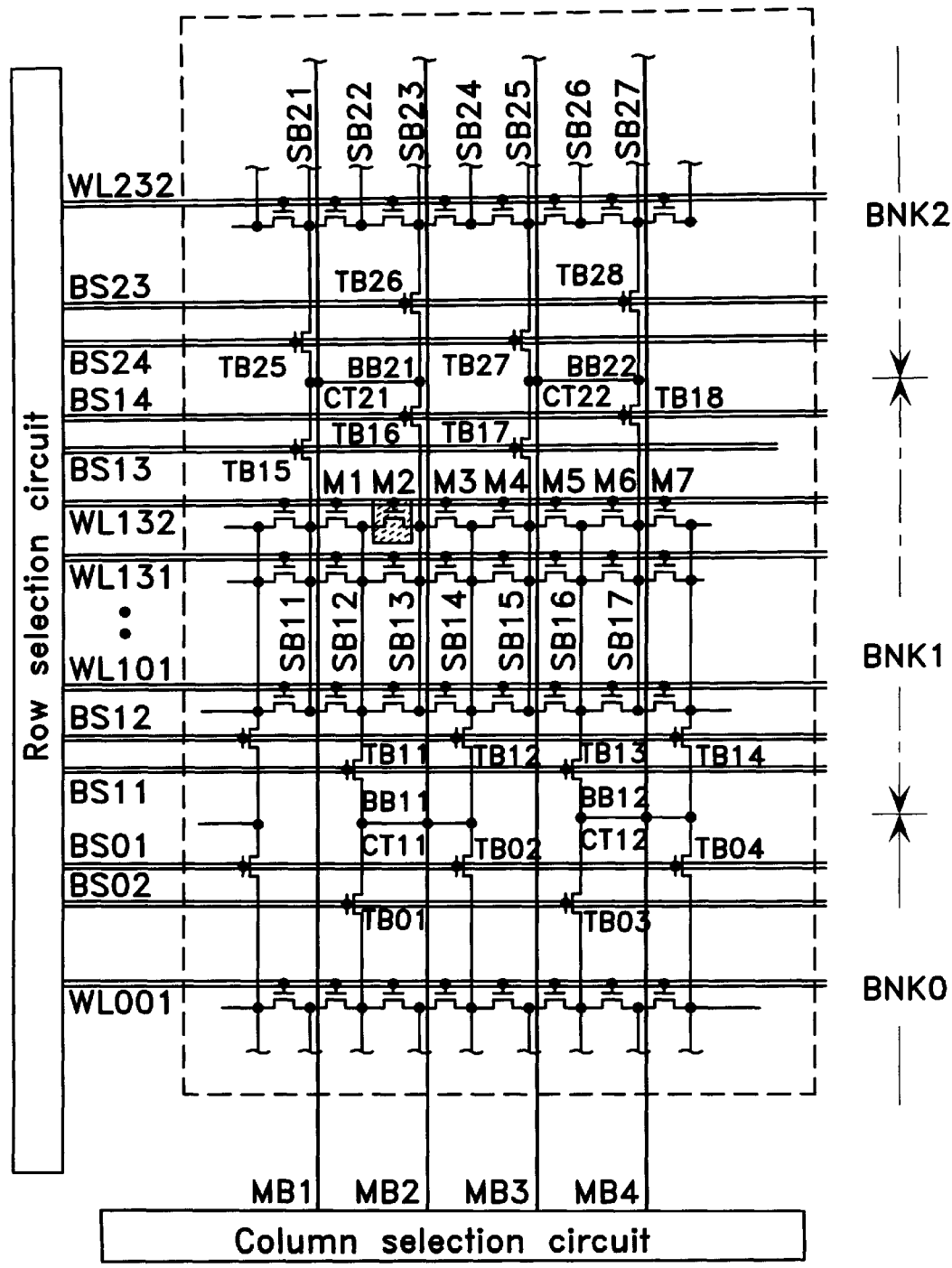
FIG. 3 shows an exemplary circuit of a mask ROM according to the present invention.
Figure 4:
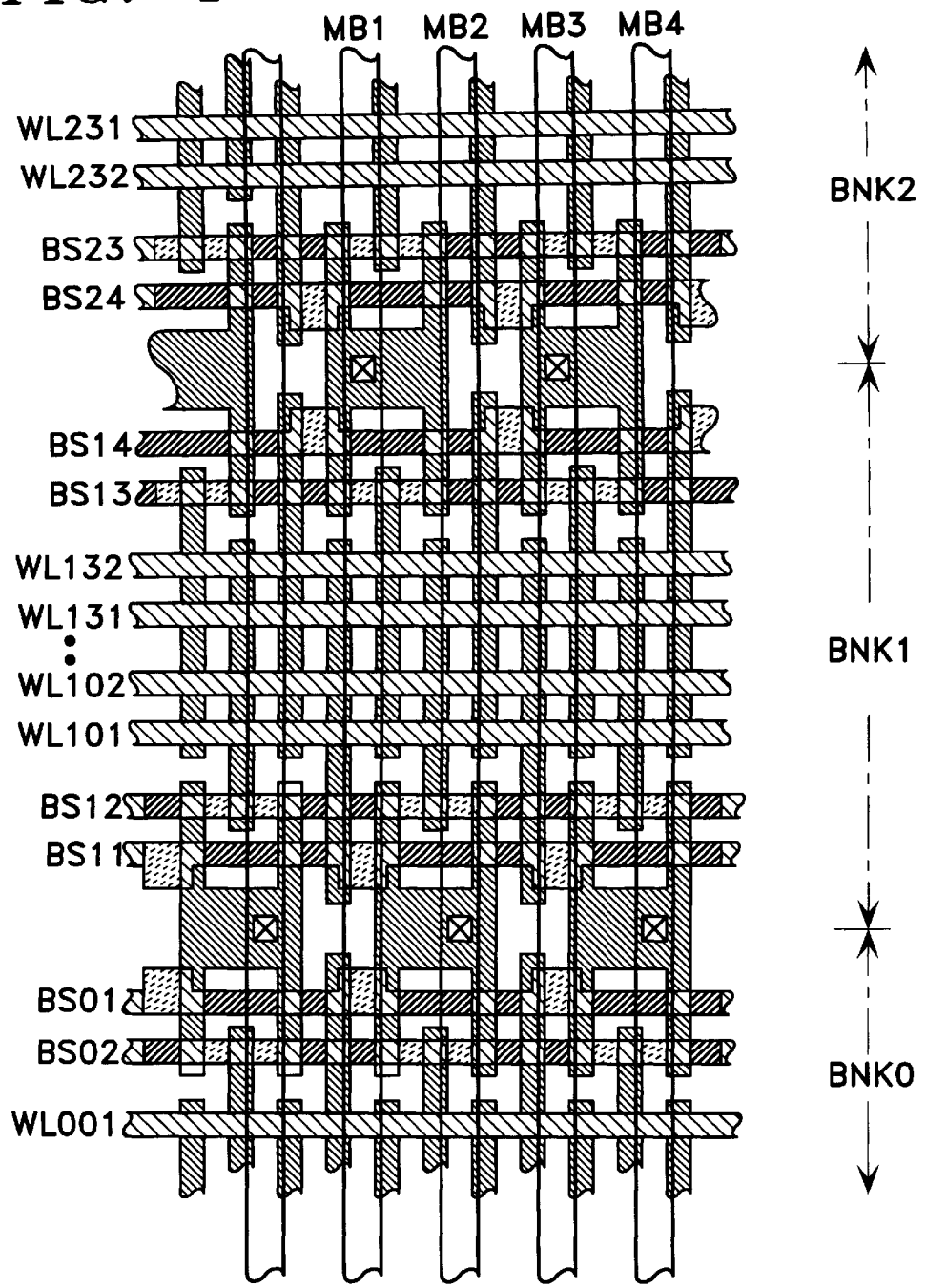
FIG. 4 shows regions into which impurity ions are to be implanted in the mask ROM shown in FIG. 3.

FIG. 3 shows an exemplary circuit of a mask ROM according to the present example. FIG. 4 shows regions into which impurity ions are to be implanted in the mask ROM shown in FIG. 3. Although not shown in FIG. 4, the substrate surface is covered with a mask (of a resist pattern or the like) except in regions where the impurity ions are to be implanted.

Figure 5:
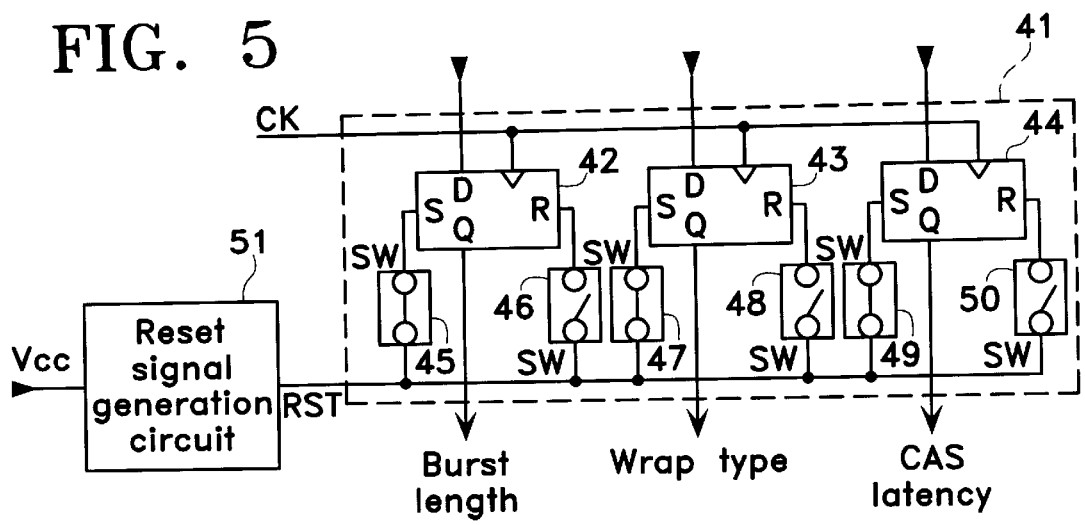
FIG. 5 is a circuit diagram illustrating an embodiment of a mode register in the synchronous mask ROM according to the present invention.

FIG. 5 is a circuit diagram illustrating an embodiment of a mode register in the synchronous mask ROM according to the present invention.

In the present specification, a "mode register" is defined as any element capable of storing operation modes, and is not limited to those composed essentially of flip-flops. For example, a mode register consisting only of fuses can be employed, as will become apparent in the discussion to follow.

As can be seen in FIG. 5, the mode register 41 includes 3-bit D flip-flops 42, 43, and 44 each having a set terminal and a reset terminal. The output signals of the D flip-flops 42, 43, and 44 represent the burst length, wrap type, and CAS latency, respectively. In practice, however, one flip-flop may be dedicated for each of 1, 2, 4, 8, and a full-length that defines the burst length; one flip-flop is similarly dedicated to each value of any other parameter, although not shown in FIG. 4.

Further with reference to FIG. 5, switch elements 45 and 46 are coupled to the set (S) and reset (R) terminals of the D flip-flop 42; switch elements 47 and 48 are coupled to the set (S) and reset (R) terminals of the D flip-flop 43; and switch elements 49 and 50 are coupled to the set (S) and reset (R) terminals of the D flip-flop 44, respectively. The other ends of the switches 45 to 50 are coupled to the output of a reset signal generation circuit 51. The reset signal generation circuit 51 outputs a reset signal RST upon supply of power.

The switches 45 to 50, which are composed of the same type of MOSFETs as those constituting the memory cells of the mask ROM, are selectively set in either an ON or OFF state in accordance with an initial value of each parameter of a given operation mode. That is, when data is written to the memory-cell MOSFETS, impurity ions are simultaneously (i.e., by using the same mask) implanted in the channel regions of the transistors constituting the switching elements in a selective manner. As a result, the switching elements are set to be either ON or OFF as desired.

Owing to the above-described switching element configuration, the initial values which are expressed by ON or OFF states of the respective switching elements are automatically set in the associated D flip-flops 42, 43, and 44 responsive to a reset signal RST which is output upon supply of power.

Figure 9:
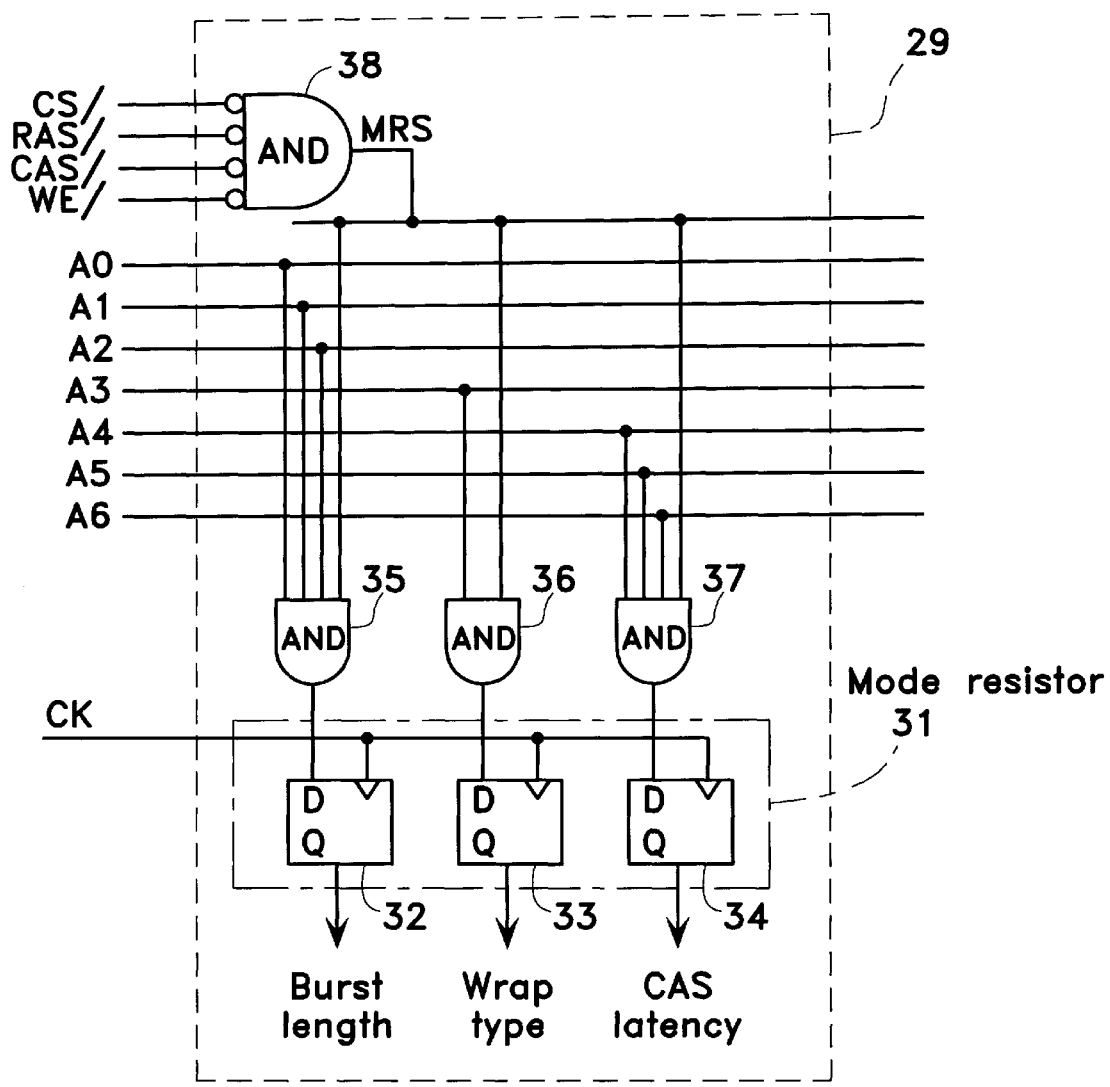
FIG. 9 is a simplified diagram showing the structure of a mode register setting circuit 29.

The mode register 41 of FIG. 5 can be employed in the place of the mode register 31 in the mode register setting circuit 29 shown in FIG. 9. In that case, the mode register 41 receives external operation mode signals via the address terminals A0 to A6 of the mode register setting circuit 29. The setting values expressed by the external operation mode signals are input to the D flip-flops 42, 43, and 44 in synchronization with a clock signal CK. As a result, the operation mode can be changed accordingly.

The mode register 41 of FIG. 5 allows rewriting of the contents set therein. However, in the case where there is no need to rewrite the contents of the mode register, the contents of the mode register only need to be set via the switching elements. This will eliminate the need of the signals supplied from the address terminals A0 to A6 of the mode register setting circuit 29 to the D flip-flops 42, 43, and 44, thereby making it possible to simplify the structure of the mode register setting circuit 29.

Figure 6:
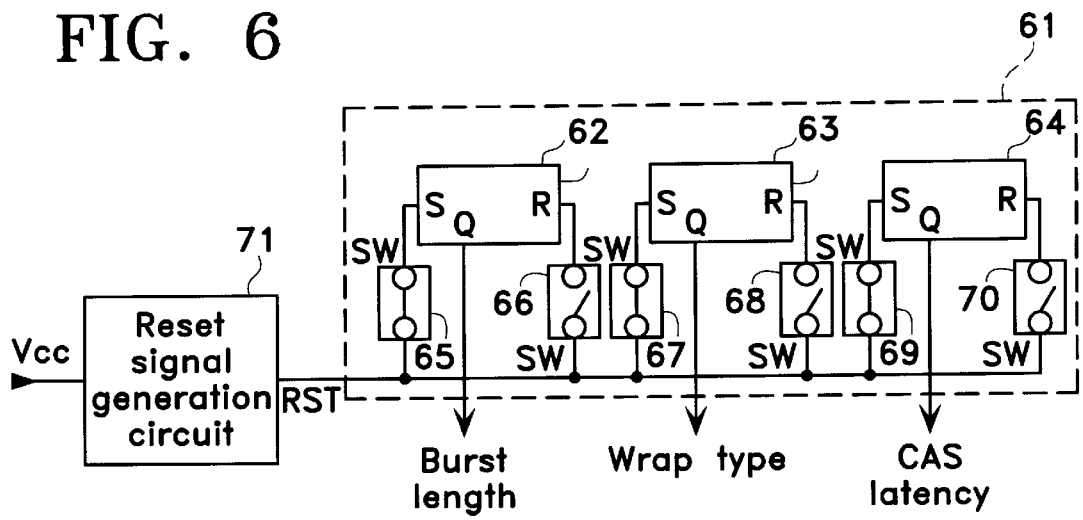
FIG. 6 is a block diagram schematically illustrating the structure of a simplified mode register 61 according to the present invention.

FIG. 6 is a block diagram schematically illustrating the structure of a simplified mode register 61.

The mode register 61 includes 3-bit D flip-flops 62, 63, and 64 each having a set terminal and a reset terminal. The output signals of the D flip-flops 62, 63, and 64 represent the burst length, wrap type, and CAS latency, respectively. In practice, however, one flip-flop may be dedicated for each of 1, 2, 4, 8, and a full-length that defines the burst length; one flip-flop is similarly dedicated to each value of any other parameter, although not shown in FIG. 4.

With reference to FIG. 6, switch elements 65 and 66 are coupled to the set (S) and reset (R) terminals of the D flip-flop 62; switch elements 67 and 68 are coupled to the set (S) and reset (R) terminals of the D flip-flop 63; and switch elements 69 and 70 are coupled to the set (S) and reset (R) terminals of the D flip-flop 64, respectively. The other ends of the switches 65 to 70 are coupled to the output of a reset signal generation circuit 71. The reset signal generation circuit 71 outputs a reset signal RST upon supply of power.

The switches 65 to 70, which are composed of the same type of MOSFETs as those constituting the memory cells of the mask ROM, are selectively set in either an ON or OFF state in accordance with an initial value of each parameter of a given operation mode. That is, when data is written to the memory-cell MOSFETS, impurity ions are simultaneously (i.e., by using the same mask) implanted in the channel regions of the transistors constituting the switching elements in a selective manner. As a result, the switching elements are set to be either ON or OFF as desired.

Owing to the above-described configuration, the initial values which are expressed by ON or OFF states of the respective switching elements are automatically set in the associated D flip-flops 62, 63, and 64 responsive to a reset signal RST which is output upon supply of power. In this case, the contents of the mode register are fixed; that is, the contents of D flip-flops 62, 63, and 64 cannot be rewritten.

Figure 7:
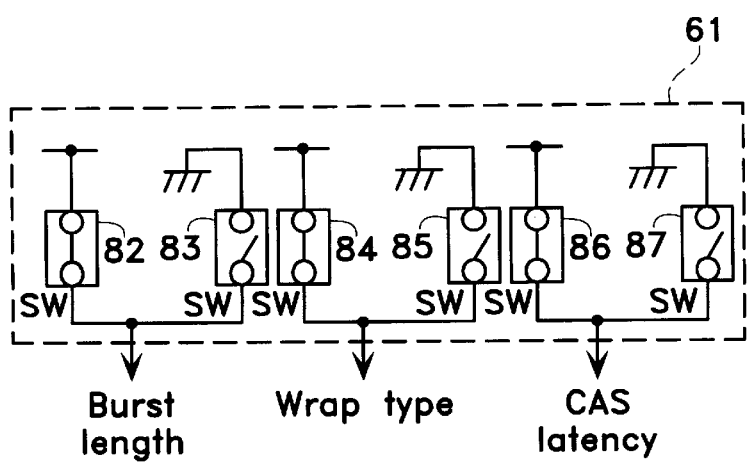
FIG. 7 is a block diagram schematically illustrating the structure of a further simplified mode register 81 according to the present invention.
Figure 8:
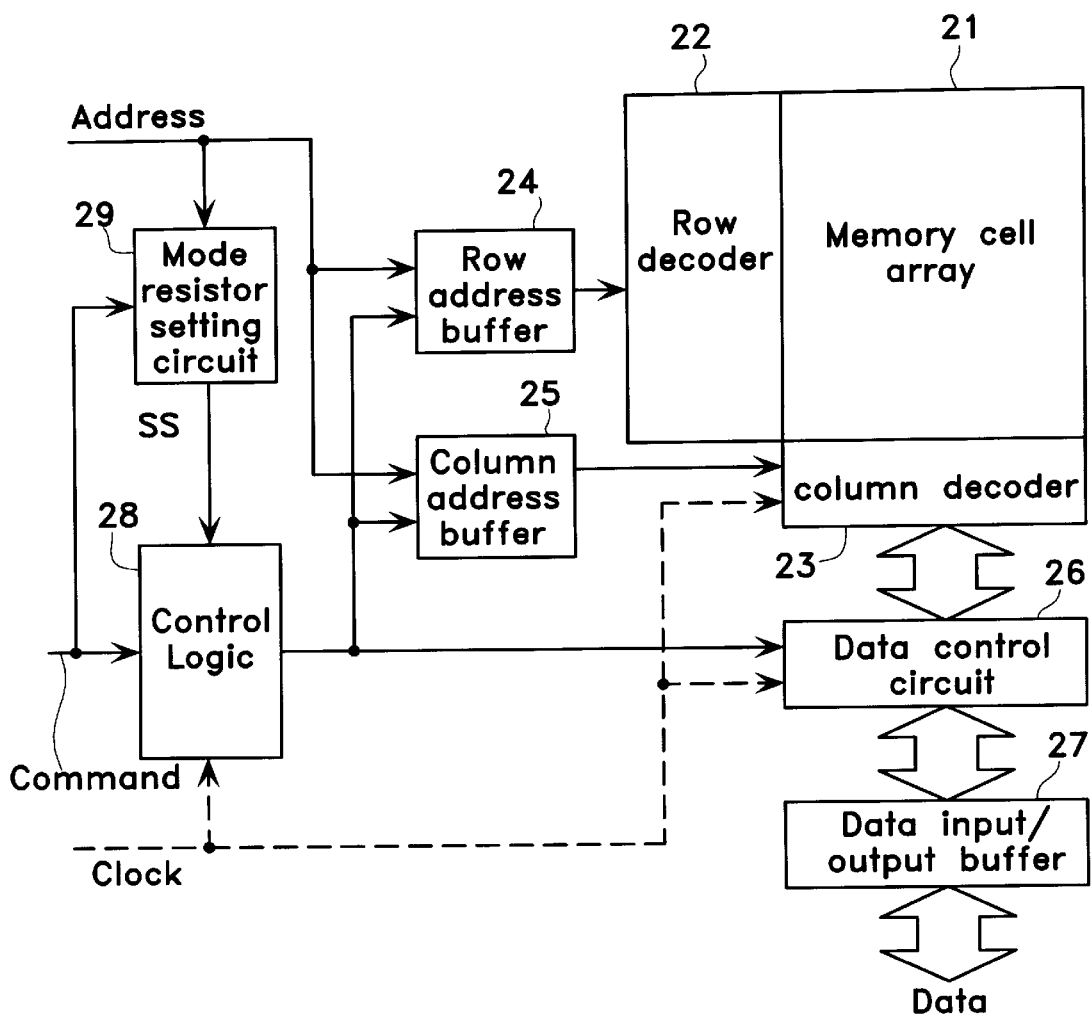
FIG. 8 is a simplified diagram schematically illustrating the structure of a synchronous DRAM.

FIG. 7 is a block diagram schematically illustrating the structure of a further simplified mode register 81.

The mode register 81 includes six switching elements 82 to 87, where switching elements 82 and 83 are paired up; switching elements 84 and 85 are paired up; and switching elements 86 and 87 are paired up. One end of each switching element in the first pair (82 and 83) is coupled to a power potential or a ground potential, whereas the other ends of the pair of switching elements 82 and 83 are connected in common to output a signal which represents the burst length. One end of each switching element in the second pair (84 and 85) is coupled to a power potential or a ground potential, whereas the other ends of the pair of switching elements 84 and 85 are connected in common to output a signal which represents the wrap type. One end of each switching element in the third pair (86 and 87) is coupled to a power potential or a ground potential, whereas the other ends of the pair of switching elements 86 and 87 are connected in common to output a signal which represents the CAS latency.

Data is written to a mask ROM during its manufacturing process in accordance with each specification desired by each user. Since the mode of use of the mask ROM (e.g., operation frequency and the like) is usually known at the time of data writing, it is possible to set a latency value which is optimum in view of design factors such as the power potential.

Moreover, a mask ROM is by nature a read only memory and usually does not accept writing thereto; therefore, realizing a system that performs mode setting to a mask ROM via an initialization routine would complicate the circuitry. In contrast, the structure according to the present invention avoids performing a mode setting via an initialization routine, thereby simplifying the system and memory configuration.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A clock-synchronized read only memory comprising a memory cell and a mode register for setting an operation mode, the clock-synchronized read only memory outputting data stored in the memory cell in the operation mode set in the mode register and in synchronization with a clock signal, wherein contents of the mode register are set when the data is written to the memory cell, the contents defining the operation mode, and wherein the operation mode is defined by burst length, wrap type and CAS latency, and wherein the mode register includes a MOS transistor having a channel region, and the contents which are set in the mode register are written by selectively implanting ions of an impurity into the channel region of the MOS transistor, the impurity having a different conductivity type from a conductivity type of the channel region of the MOS transistor.

2. A clock-synchronized read only memory according to claim 1, wherein the implantation of the ions of the impurity is performed by using a mask which is used when writing the data to the memory cell.

3. A clock-synchronized read-only memory according to claim 1, wherein the memory cell is a mask ROM.

4. A clock-synchronized read only memory according to claim 1, wherein the burst length is the number of data units which can be consecutively input or output, the wrap type describes the manner in which column addresses that are internally generated during a burst access are varied, and the CAS latency is the number of clock pulses that elapse before the first data are read after inputting a read command.

* * * * *